(12) United States Patent
Lagorgette et al.

(10) Patent No.: US 9,877,401 B2
(45) Date of Patent: Jan. 23, 2018

(54) PORTABLE ELECTRONIC DEVICE PROVIDED WITH A BATTERY ENCLOSURE

(71) Applicant: ETA SA Manufacture Horlogere Suisse, Grenchen (CH)

(72) Inventors: Pascal Lagorgette, Bienne (CH); Vittorio Zanesco, Neuchatel (CH); Raphael Balmer, Vicques (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 0 days.

(21) Appl. No.: 15/297,367

(22) Filed: Oct. 19, 2016

(65) Prior Publication Data

US 2017/0171993 A1   Jun. 15, 2017

(30) Foreign Application Priority Data

Dec. 11, 2015  (EP) .................................... 15199647

(51) Int. Cl.
| | |
|---|---|
| *H05K 5/00* | (2006.01) |
| *G04B 37/00* | (2006.01) |
| *G04G 19/00* | (2006.01) |
| *G04C 10/00* | (2006.01) |
| *G04C 3/00* | (2006.01) |
| *H01M 2/10* | (2006.01) |

(52) U.S. Cl.
CPC ........... *H05K 5/0026* (2013.01); *G04B 37/00* (2013.01); *G04C 3/008* (2013.01); *G04C 10/00* (2013.01); *G04G 19/00* (2013.01); *H01M 2/1044* (2013.01); *H05K 5/0086* (2013.01); *H01M 2220/30* (2013.01)

(58) Field of Classification Search
CPC .... H05K 5/0026; H05K 5/0086; G04B 37/00; G04C 3/008; G04C 10/00; H01M 2/1044
USPC ... 361/752, 679.01, 724, 728, 748, 760, 769
See application file for complete search history.

(56) References Cited

U.S. PATENT DOCUMENTS

| | | |
|---|---|---|
| 3,945,193 A | 3/1976 | Yasuda et al. |
| 6,124,056 A | 9/2000 | Kimura |
| 7,059,894 B1 | 6/2006 | Huang |
| (Continued) | | |

FOREIGN PATENT DOCUMENTS

| | | |
|---|---|---|
| CH | 706 353 A2 | 10/2013 |
| EP | 0 961 356 A2 | 12/1999 |
| EP | 1 184 750 A1 | 3/2002 |

OTHER PUBLICATIONS

European Search Report dated Jun. 14, 2016 in European Application 15199647.7 filed on Dec. 11, 2015 (with English Translation of Categories of Cited Documents).

*Primary Examiner* — Tremesha S Willis
(74) *Attorney, Agent, or Firm* — Oblon, McClelland, Maier & Neustadt, L.L.P.

(57) ABSTRACT

A portable electronic device includes at least one electronic module and the electronic module includes, in particular, a main plate provided with a cavity arranged for receiving an electrical energy source, at least one movement associated with a printed circuit, an elastically deformable contact member for ensuring an electrical connection between the electrical energy source and the printed circuit, and a holder for holding the electrical energy source. The holder includes a removable holder made of insulating material arranged to receive the energy source and including a removable clamp for holding the energy source in place. The holder can be inserted inside the cavity.

9 Claims, 3 Drawing Sheets

(56) References Cited

U.S. PATENT DOCUMENTS

2003/0118893 A1  6/2003  Takahashi et al.
2004/0121226 A1  6/2004  Kaelin et al.

PORTABLE ELECTRONIC DEVICE PROVIDED WITH A BATTERY ENCLOSURE

This application claims priority from European Patent application 15199647.7 of Dec. 11, 2015, the entire disclosure of which is hereby incorporated herein by reference.

FIELD OF THE INVENTION

The invention relates to the field of horology, and in particular the field of watches comprising at least one electronic or electrical circuit powered by an accumulator such as a cell battery or similar. The invention more particularly concerns a portable electronic device provided with a standard battery enclosure.

BACKGROUND OF THE INVENTION

The prior art comprises numerous documents relating to battery mounting devices.

WO Patent Application 01/77760A1 discloses a device for mounting a cell battery inside the case of an electronic watch. This device comprises, in particular, a substantially cylindrical housing, moulded from plastic material and opening onto the back side of the watch. The housing comprises, on its periphery, tongues extending from the bottom towards the opening and preferably moulded in one-piece with the housing. Each tongue is arranged to form a support area on the face of the battery oriented on the side of the opening, when the battery is mounted inside the housing. Mounting is achieved by elastically deforming the tongues.

However, this particular structure has a drawback in that, in order to introduce a battery into the housing, the latter has to be inserted slantwise through the aperture of the housing. Thus, this insertion is difficult to implement in an automated assembly line.

Such a device also has the drawback that the battery may not be properly held in place in the event of a shock. Indeed, if the shock is sufficiently violent, the battery, which has a relatively large mass compared to the constituent elements of the watch, may be projected in a direction such that it can deform the elastic tongues and leave the housing, which may risk interrupting the supply of electrical power to the watch.

Yet another drawback of this device is that, when the diameter of the calibre or the height of the battery changes, the plastic housing must be adjusted and a new mould ordered, which involves additional development and equipment costs for each new model.

SUMMARY OF THE INVENTION

It is an object of the invention to overcome the various drawbacks of these known techniques.

More specifically, it is an object of the invention to provide a portable electronic device provided with a battery enclosure offering good retention of the battery inside its housing.

It is also an object of the invention, at least in a particular embodiment, to provide a portable electronic device provided with a battery enclosure that is simple and inexpensive to implement.

Yet another object of the invention is to provide a battery enclosure compatible with several battery thicknesses, different movements for a portable electronic device, and various angular positions of the movement.

These objects, in addition to others that will appear more clearly hereinafter, are achieved according to the invention by means of a portable electronic device comprising at least one electronic module, the electronic module comprising, in particular, a main plate provided with a cavity arranged for receiving an electrical energy source, at least one movement associated with a printed circuit, an elastically deformable contact member for ensuring an electrical connection between the electrical energy source and the printed circuit, and means for holding the electrical energy source.

According to the invention, the means for holding the electrical energy source comprise:
a removable holder made of insulating material comprising a bottom and a wall, the holder being arranged to receive the electrical energy source and comprising a removable clamp for holding the electrical energy source in place, the holder being configured to be inserted inside the cavity,
contact means for ensuring an electrical connection between the printed circuit and the clamp, and
securing means for removably securing the holder to the module.

Thus, the subject of the present invention, through the various functional and structural aspects described above, makes it possible to obtain a portable electronic device able to receive different sizes of calibre and/or different sizes of battery without concern as to whether the battery is properly retained.

In accordance with other advantageous variants of the invention:
the clamp comprises a central portion extending over the bottom of the holder and a lateral portion extending over one part of the circular wall, the central portion and the lateral portion each comprising at least one strip spring for respectively exerting an axial force and a radial force on the electrical energy source;
the contact means for ensuring the electrical connection between the printed circuit and the clamp take the form of a spring;
the wall of the holder has a housing extending over all or part of the height of the holder and which is arranged to receive the spring, the spring protruding from both sides of the housing;
the clamp comprises a tongue arranged to be inserted in an aperture in immediate proximity to the bottom of the holder and emerging in the housing such that the spring is in contact with the tongue and the printed circuit;
the clamp is snapped into the holder;
the means for securing the holder to the module comprise securing lugs cooperating with screw means;
the holder is made of plastic material;
the contact member is in contact with the negative pole and the clamp is in contact with the positive pole.

BRIEF DESCRIPTION OF THE DRAWINGS

Other characteristics and advantages of the invention will appear more clearly upon reading the following description of a specific embodiment of the invention, given simply by way of illustrative and non-limiting example, and the annexed Figures, among which.

DETAILED DESCRIPTION OF PREFERRED EMBODIMENTS

Figure 1:
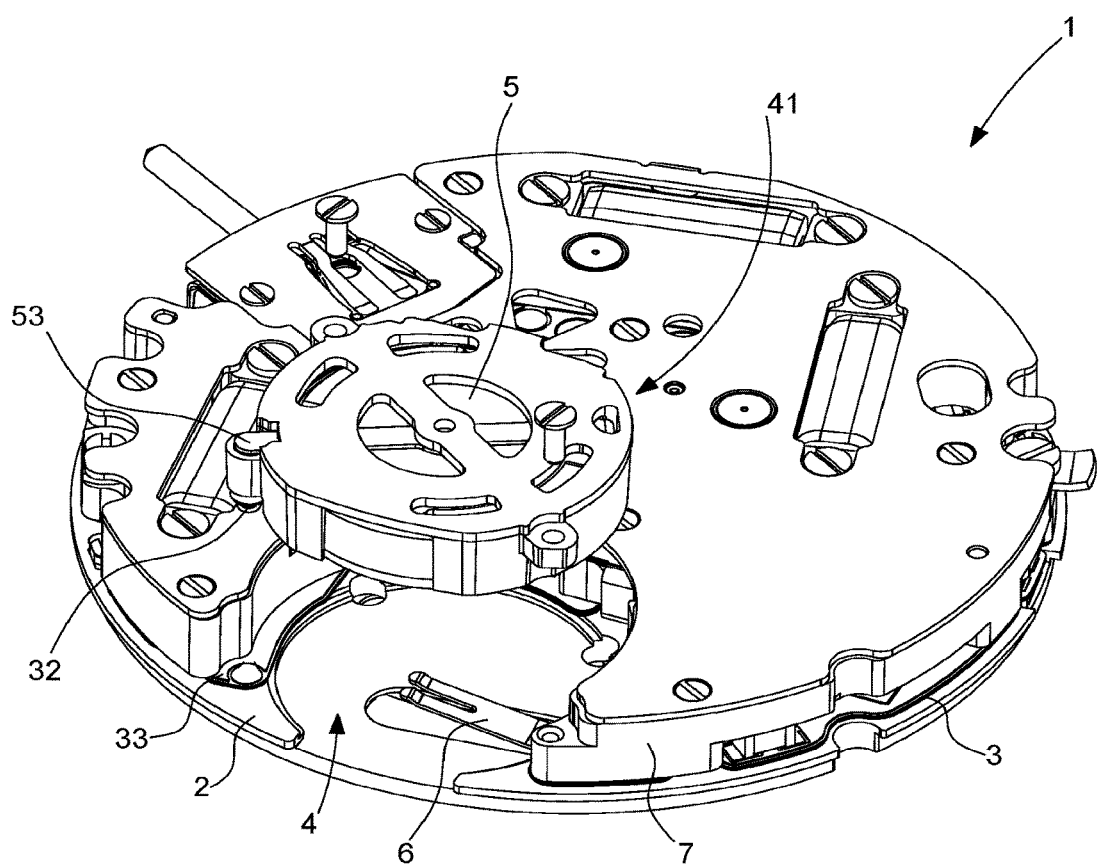
FIG. 1 is a perspective view of an electronic module for a portable electronic device according to the invention.
Figure 2:
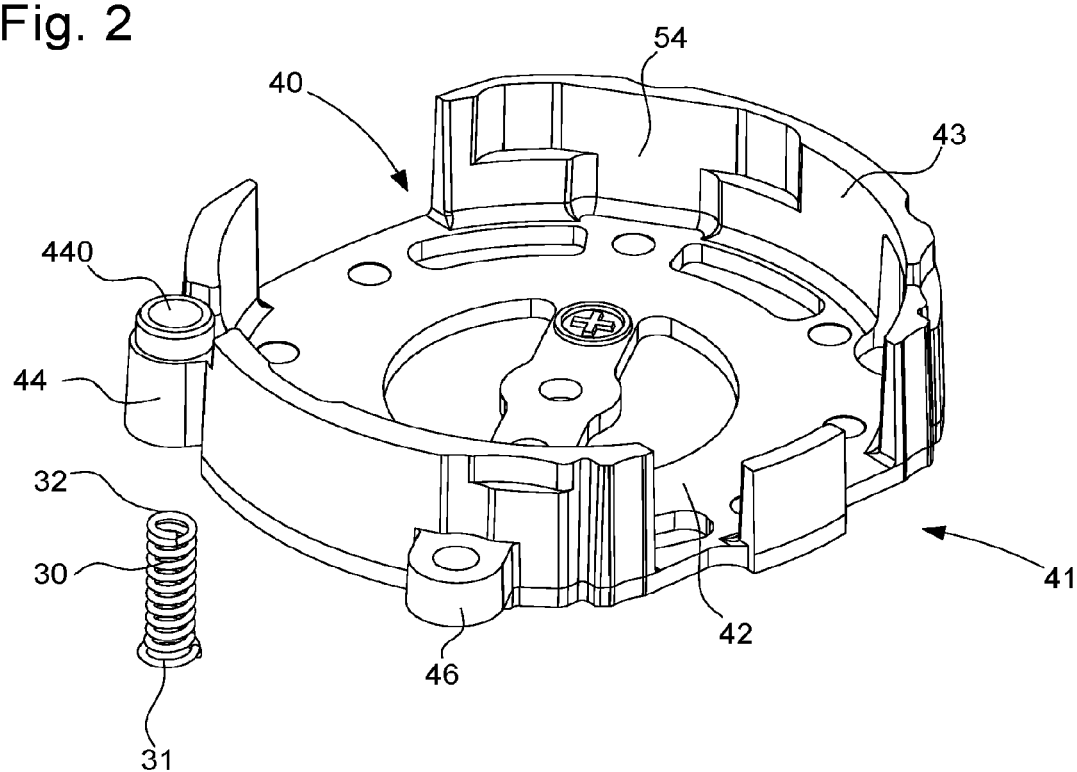
FIGS. 2 to 5 are perspective views of the means for holding the electrical energy source according to the invention.
Figure 3:
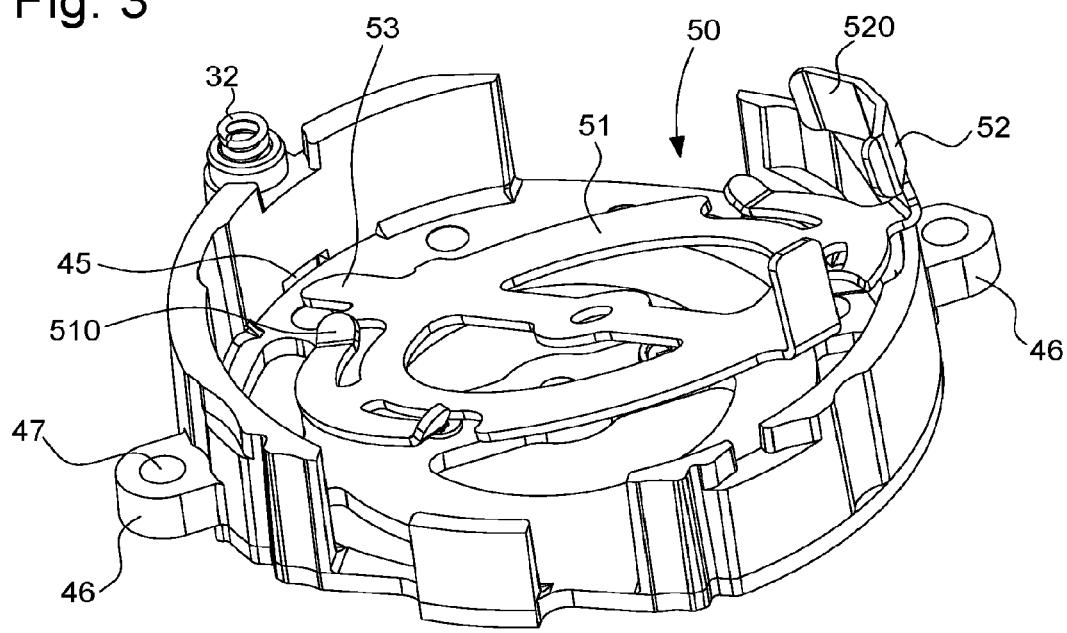
Figure 4:
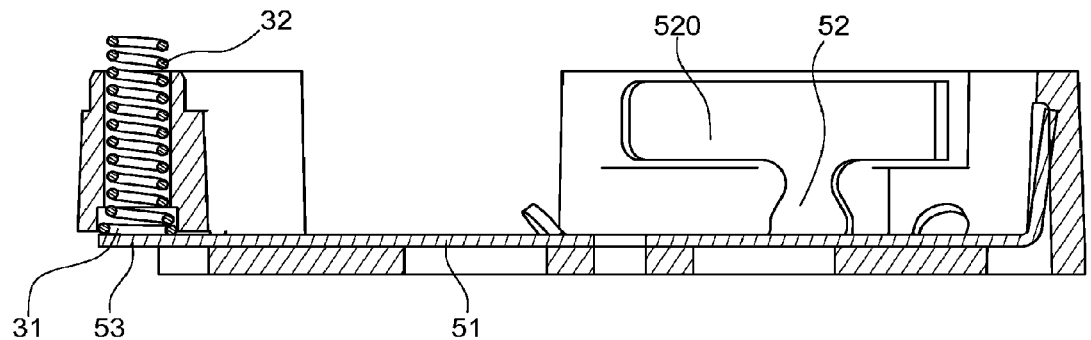
Figure 5:
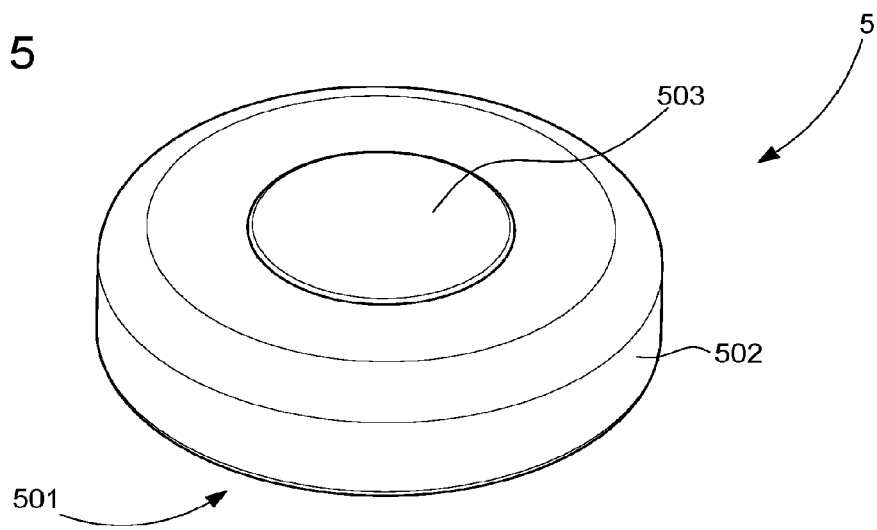
Figure 5:
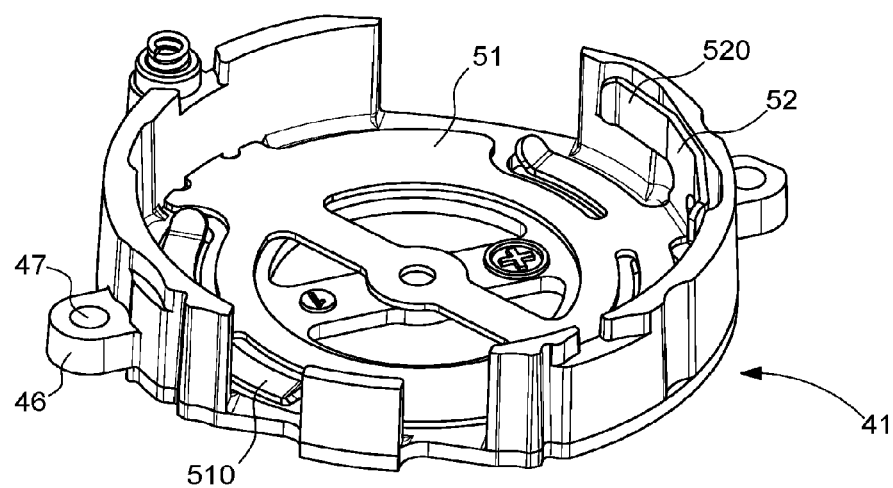

A portable electronic device according to a particular embodiment will now be described below with reference to FIGS. 1 to 5 together.

The invention concerns a portable electronic timepiece device, particularly a watch, comprising at least a case middle and a back cover (not represented in the Figures) for containing an electronic or electrical module 1. This module 1 comprises a main plate 2 having a cavity 4 which is arranged to receive an electrical energy source 5, such as a button cell battery. This module 1 also comprises at least one movement 7 associated with a printed circuit 3 with at least one contact member 6 for ensuring an electrical connection between electrical energy source 5 and printed circuit 6.

In a preferred but non-limiting version of the invention, contact member 6 is elastically deformable and is made in the form of a strip spring.

As seen in FIG. 1, contact member 6 is arranged to bear on electrical energy source 5 when the latter is placed inside cavity 4. The support, which is both electrical and mechanical, is achieved as a result of the particular shape of contact member 6 and its effect is amplified by placing member 6 under stress via a compressive stress exerted towards case back 2, by electrical energy source 5.

According to the invention, the portable electronic device comprises means for holding electrical energy source 5 configured to be inserted inside cavity 4 in order to set electrical energy source 5 in place easily while avoiding a short-circuit.

As can be observed in FIGS. 2 to 5, the holding means comprise a removable holder 41 made of insulating material having a bottom 42 and a circular wall 43 extending from bottom 42 to form a housing 40 arranged to receive electrical energy source 5. In a preferred but non-limiting version of the invention, holder 41 is made of a plastic material in order to insulate electrical energy source 5 from module 1.

According to a variant of the invention, cavity 4 can be machined at different places on main plate 2 depending on the movement 7 selected. Indeed, because the position of the counters may be modified according to the model, the position of the motors may also be modified, and it may be necessary to shift the machining of cavity 4 without this having an effect on the placing of holder 41 inside module 1 on main plate 2.

Holder 41 also comprises a removable clamp 50 for holding electrical energy source 5 in place. Clamp 50 comprises a central portion 51 of circular shape extending over the bottom of holder 41 and a lateral portion 52 extending over one part of circular wall 43, central portion 51 and lateral portion 52 each comprising at least one strip spring 510, 520 for respectively exerting an axial force and a radial force on the energy source in order to hold electrical energy source 5 in place and prevent the latter from turning on itself. Clamp 50 may be snapped into holder 41 through the lateral portion by means of a complementary portion 54 formed on the inner face of the wall of holder 41.

According to a preferred embodiment of the invention, clamp 50, formed by central portion 51 and lateral portion 52, is obtained via a stamping method from a single component made of a conductive material, such as copper or brass, for example.

The respective dimensions of electrical energy source 5 and of holder 41 are such that the latter is able to accommodate electrical energy source 5, with lower face 501 of electrical energy source 5 bearing against central portion 51 of clamp 50 located at the bottom of holder 41 and the edge 502 of electrical energy source 5 bearing against lateral portion 52 of the clamp and against the inner surface of circular wall 43.

According to the invention, the clamp is in contact with the positive pole of electrical energy source 5 and contact member 6 is in contact with the negative pole of electrical energy source 5. Of course, the two poles can be reversed, so that the clamp is in contact with the negative pole.

The holding means also comprise contact means for ensuring an electrical connection between printed circuit 3 and clamp 50. According to a preferred embodiment of the invention, the contact means take the form of a helical type spring 30, made of a material having good electrical conductivity.

As seen in FIGS. 2 to 5, on the outer face of its wall 43, holder 41 has a tubular housing 44 extending over all or part of the top of holder 41 and integral with holder 41. Tubular housing 44 comprises a through hole 440, of circular cross-section, arranged to receive spring 30, the spring protruding on both sides at each end of tubular housing 44. Advantageously, spring 63 has one end, called the spring base 31, which is wider than the diameter of through hole 440 so as to form a stop and so that spring 30 is held in place inside housing 44, the other end 32 of the spring protruding from tubular housing 44.

In order to ensure the electrical connection between printed circuit 3 and clamp 50, clamp 50 comprises a tongue 53 arranged to be inserted into an aperture 45 in immediate proximity to bottom 42 of holder 41 and emerging at one end of housing 44 so that spring 30, and more particularly spring base 31, is in contact with tongue 53 and printed circuit 6 via each of its ends.

In order to keep holder 41 in place on module 1 once electrical energy source 5 is placed inside the holder, securing means are provided outside holder 41 to removably secure holder 41 to module 1.

As represented in the Figures, the securing means are formed by securing lugs 46, opposite to each other, and each having an orifice 47 for the passage of a threaded shaft intended to be screwed into module 1.

The means for holding electrical energy source 5 are set in place as follows.

First, spring 30 is inserted into tubular housing 44, from the bottom, through through hole 440 so that spring base 31 is at the same level as the bottom of holder 41, in immediate proximity to aperture 45. Then clamp 50 is inserted slantwise into housing 40 of holder 41, by first inserting tongue 53 into aperture 45. Central portion 51 of clamp 50 is then bent down over bottom 42 of holder 41 and snapped into the latter by means of lateral portion 52 of clamp 50, which has the effect of pressing tongue 53 against base 31 of spring 31 once clamp 50 is snapped into housing 40.

The insertion of electrical energy source 5 into holder 41 is achieved by positioning lower face 501 of electrical energy source 5 opposite bottom 42 of the holder, and then exerting pressure on upper face 503 of electrical energy source 5 in the direction of bottom 42 of the holder. During this operation, the at least one strip spring 520 of lateral portion 52 is pushed back towards circular wall 43 by lateral face 502 of electrical energy source 5, which causes an elastic deformation of strip spring 520, thereby ensuring good radial retention of electrical energy source 5.

Further, the at least one strip spring 510 of central portion 51 is pushed back towards bottom 42 of the holder, which causes an elastic deformation of strip spring 510 and thereby ensures good axial retention of electrical energy source 5.

Once electrical energy source 5 is engaged inside housing 40 of holder 41, the latter is placed inside cavity 40 so as to position upper face 503 against contact member 8 and to line up securing lugs 46 with the corresponding holes in module 1.

When holder 41 is set in place, contact member 8 is pushed back towards main plate 2 and is placed under stress, and end 32 of spring 30 is placed in contact with printed circuit 3 on a contact area 33, which ensures the electrical contact with electrical energy source 5.

Further, during a servicing operation such as a change of electrical energy source 5, servicing is facilitated by the openwork structure of holder 41 which allows for easy removal of electrical energy source 5. The openwork structure of holder 41 also has the advantage of facilitating the flow of air around electrical energy source 5.

As a result of these different aspects of the invention, there is obtained a portable electronic device that can adapt to many sizes of battery and different sizes of calibre. The invention also allows for adaptation to different angular positions of the movement, as the machining required to form cavity 4 may be carried out at different places on main plate 2. For example, when the position of the counters is modified, the position of the motors is also modified, and the machining of cavity for receiving holder 41 can simply be shifted without having to devise a new component for holding electrical energy source 5.

The above description corresponds to a preferred embodiment and should in no way be considered limiting, more particularly as regards the shape described for the various structural elements forming the mounting device, or their materials.

NOMENCLATURE

1. Module
2. Plate
3. Printed circuit,
4. Cavity
5. Electrical energy source
6. Contact member
7. Movement
30. Spring,
31. Spring base
32. Free end of the spring
33. Contact area of the printed circuit
40. Housing
41. Holder
42. Bottom of the holder
43. Wall of the holder
44. Tubular housing
440. Through hole 78
45. Aperture
46. Securing lugs
47. Orifice,
50. Clamp,
51. Central portion of the clamp
52. Lateral portion of the clamp
53. Tongue
54. Complementary portion
501. Lower face
502. Lateral face
503. Upper face
510, 520. Clamp strip springs

What is claimed is:

1. A portable electronic device comprising:
   at least one electronic module, the electronic module comprising, a main plate provided with a cavity arranged for receiving an electrical energy source, at least one movement associated with a printed circuit, an elastically deformable contact member for ensuring an electrical connection between the electrical energy source and the printed circuit, and means for holding the electrical energy source,
   wherein the means for holding the electrical energy source comprise:
      a removable holder made of insulating material comprising a bottom and a circular wall, the holder being arranged to receive the electrical energy source and comprising a removable clamp for holding the electrical energy source in place, the holder being configured to be inserted inside the cavity,
      contact means for ensuring an electrical connection between the printed circuit and the clamp, the contact means including a helical spring positioned in a housing of the holder that is located radially outside of an inner face of the circular wall of the holder, and
      securing means for removably securing the holder to the module.

2. The portable electronic device according to claim 1, wherein the clamp comprises a central portion extending over the bottom of the holder and a lateral portion extending over one part of the circular wall, the central portion and the lateral portion each comprising at least one strip spring for respectively exerting an axial force and a radial force on the electrical energy source.

3. The portable electronic device according to claim 1, wherein the spring protrudes above a top of the housing.

4. The portable electronic device according to claim 3, wherein the circular wall of the holder includes an aperture and the clamp comprises a tongue that extends through the aperture in immediate proximity to the bottom of the holder and emerging in the housing located radially outside of the inner face of the circular wall of the holder such that the spring is in contact with the tongue and the printed circuit.

5. The portable electronic device according to claim 1, wherein the clamp is snapped into the holder.

6. The portable electronic device according to claim 1, wherein the means for securing the holder to the module comprise securing lugs cooperating with screw means.

7. The portable electronic device according to claim 1, wherein the holder is made of plastic material.

8. The portable electronic device according to claim 1, wherein the contact member is in contact with a negative pole of the electrical energy source and the clamp is in contact with a positive pole of the electrical energy source.

9. The portable electronic device according to claim 1, wherein the spring extends through a through hole in the housing, the spring includes a base that protrudes below the through hole of the housing, and the base of the spring is wider than a diameter of the through hole to hold the spring in place in the housing.

\* \* \* \* \*